US006484134B1

(12) United States Patent
Hoskote (10) Patent No.: US 6,484,134 B1
(45) Date of Patent: Nov. 19, 2002

(54) PROPERTY COVERAGE IN FORMAL VERIFICATION

(75) Inventor: Yatin V. Hoskote, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/336,302

(22) Filed: Jun. 20, 1999

(51) Int. Cl.[7] .............................................. G06F 17/50

(52) U.S. Cl. ................................ 703/14; 703/2; 716/2; 716/3; 716/4

(58) Field of Search ............................ 703/1–4, 13–22; 716/1–7

(56) References Cited

U.S. PATENT DOCUMENTS

| | | | | |
|---|---|---|---|---|
| 6,074,426 A | * | 6/2000 | Baumgartner et al. | ......... 703/13 |
| 6,157,901 A | * | 12/2000 | Howe | ............................. 703/2 |
| 6,212,669 B1 | * | 3/2001 | Jain | ............................... 716/7 |

FOREIGN PATENT DOCUMENTS

| | | | |
|---|---|---|---|
| EP | 0862128 | 9/1998 | ........... G06F/17/50 |

OTHER PUBLICATIONS

Fallah et al, "OCCOM: Efficient Computation of Observability–Based Code Coverage Metrics for Functional Verification", Proceedings of the 35th Design Automation Conference, pp. 152–157 (Jun. 1998).*
Moundanos et al, "Abstraction Techniques for Validation Coverage Analysis and Test Generation", IEEE Transactions on Computers, vol. 47 No. 1, pp. 2–14 (Jan. 1998).*
Swamy, "Formal Verification of Digital Systems", Proceedings of the Tenth International Conference on VLSI Design, pp. 213–217 (Jan. 1997).*

Pixley et al, "Commercial Design Verification: Methodology and Tools", Proceedings of the International Test Conference, pp. 839–848 (Oct. 1996).*
Grinwald, R., et al., "User Defined Coverage—A Tool Supported Methodology for Design Verification", Proceedings of the 35th Design and Automation Conference, San Francisco, CA, 15–19, (Jun., 1998).
Moundanos, D., et al., "Using Verification Technology for Validation Coverage Analysis and Test Generation", Proceedings of the 16th IEEE VLSI Test Symposium, Monterey, CA, 254–259, (Apr., 1998).
Bryant, R.E., "Graph–Based Algorithms for Boolean Function Manipulation", *IEEE Transactions on Computers* C–35 (8), 677–691, (Aug. 1986).
Cheng, K., et al., "Automatic Functional Test Generation Using the Extended Finite State Machine Model", Proceedings of the 30th Design Automation Conference, Conference held at the Dallas Convention Center, Dallas, Texas, 86–91, (Jun. 14–18, 1993).

(List continued on next page.)

Primary Examiner—Kevin J. Teska
Assistant Examiner—Samuel Broda
(74) Attorney, Agent, or Firm—Schwegman, Lundberg, Woessner & Kluth, P.A.

(57) ABSTRACT

One aspect of the invention is a coverage metric to identify that part of a state space which is covered by properties verified by model checking. In each property, a signal is identified (or a proposition on several signals) as the observed signal in that property. The coverage metric measures the coverage of a set of properties with respect to the observed signal. The coverage metric identifies the reachable states in which the value of the observed signal determines the validity of the verified properties. Then a model checking algorithm can be used to check the correctness condition on the observed signal in these "covered" states to prove or disprove the property.

28 Claims, 3 Drawing Sheets

OTHER PUBLICATIONS

Cho, H., et al., "Redundancy Identification/Removal and Test Generation for Sequential Circuits Using Implicit State Enumeration", *IEEE Transactions on Computer–Aided Design of Integrated Circuits and Systems*, 12 (7), 935–945, (Jul. 1993).

Clarke, E.M., et al., "Automatic Verification of Finite–State Concurrent Systems Using Temporal Logic Specifications", *ACM Transactions on Programming Languages and Systems*, 8 (2), 244–263, (Apr. 1986).

Devadas, S., et al., "An Observability–Based Code Coverage Metric for Functional Simulation", Proceedings of the IEEE/ACM International Conference on Computer–Aided Design, Digest of Technical Papers, Conference held in San Jose, CA, 418–425, (Nov. 10–14, 1996).

Ho, P., et al., "Formal Verification of Pipeline Control Using Controlled Token Nets and Abstract Interpretation", Proceedings of the ICCAD International Conference on Computer–Aided Design, Conference held in San Jose, CA, 529–536, (Nov. 8–12, 1998).

Ho, R.C., et al., "Architecture Validation for Processors", Proceedings of the 22nd Annual International Symposium on Computer Architecture, Symposium held in Santa Margherita Ligure, Italy, 404–413, (Jun. 22–24, 1995).

Hoskote, Y.V., et al., "Automatic Extraction of the Control Flow Machine and Application to Evaluating Coverage of Verification Vectors", Proceedings of the International Conference on Computer Design: VLSI in Computers & Processors, Conference held in Austin, Texas, 532–537, (Oct. 2–4, 1995).

Kantrowitz, M., et al., "I'm Done Simulating; Now What? Verification Coverage Analysis and Correctness Checking of the DECchip 21164 Alpha Microprocessor", Proceedings of the 33rd Design Automation Conference, Conference held at the Las Vegas Convention Center, Las Vegas, NV, 325–330, (Jun. 3–7, 1996).

McMillian, K.L., Symbolic Model Checking, Kluwer Academic Publishers, Norwell, Massachusetts, 1–194, (1998).

* cited by examiner

FIG. 5

PROPERTY COVERAGE IN FORMAL VERIFICATION

FIELD OF THE INVENTION

The present invention is related to computer-aided design (CAD), and more particularly to property coverage in formal verification of integrated circuits.

BACKGROUND INFORMATION

One of the problems with modem logic design is the verification that the design actually works in the way it was intended to work. Undetected errors in the logic design may cause costly redesigns, or even loss of consumer confidence in the product if the product has been released on the market.

Model checking is one method of verifying designs. Model checking is a formal verification (FV) technology for property verification. A property specifies the desired values of particular circuit signals at various points in time in relation to other signals. Given a model of a design and some desired properties, a model checker like Symbolic Model Verifier (SMV) verifies whether the model satisfies all the desired properties under all possible input sequences. The properties are specified in a property specification language such as Computation Tree Logic (CTL). Although model checking is an exhaustive FV technique, a bug can escape the model checking effort if the properties specified by the user do not check for the erroneous behavior caused by the bug. Such erroneous behavior usually occurs in some obscure corner case that has been missed by the user. This is quite common when the specification has to be manually decomposed into a set of smaller, more tractable properties that are verifiable by the model checker. To reduce bug escapes, the user needs to continuously strengthen existing properties and specify new properties, without knowing if the additional verification is insufficient or redundant.

Logic simulation is another method of verifying designs. In existing simulation-based verification methodologies, coverage metrics are used to improve the quality of a test suite and estimate the progress of the verification task. For example, a common coverage metric for simulation is "code coverage", which measures the fraction of hardware description language ("HDL") statements exercised during simulation. An "observability based code coverage" enhances this metric by factoring potential error propagation to observability points. "Transition coverage" is another metric for control state machines. Such coverage metrics are effective in reducing bug escapes by pointing out coverage holes in the test suite.

However, the existing coverage metrics for simulation do not apply directly to model checking, e.g., a naive interpretation of the code coverage or transition coverage metric on a model checking task gives a meaningless coverage of 100% for every property. Logic simulation is dynamic and its coverage is driven by input simulation vectors, whereas model checking is static without any notion of circuit execution. Unlike logic simulation, the likelihood of having a bug escape detection in a model checking effort depends solely on the quality of the properties verified. Therefore, what is needed is a coverage metric that estimates the "completeness" (i.e. the quality) of a set of properties against which the design has been verified.

For example, consider the CTL formula for count, a modulo-5 counter, with stall and reset as external inputs:

AG[((-stall∧-reset∧(count=C)∧(C<5))→AX(count=C+1)]

This formula specifies that if the stall and reset signals are deasserted and the counter value is less than 5, then the counter increments by 1 in the next step. The model checker explores the entire reachable state space to verify the property. However, in reality, it ascertains the correctness of the condition on count (that it increments correctly) only in those states that are immediate successors of states satisfying the antecedent. The actual checking of the correctness condition on the model state space is thus constrained by the CTL formula. Thus, this property cannot be said to provide 100% coverage. This example illustrates the need to define a coverage measure for formally verified properties.

For this and other reasons, there is a need for the present invention.

SUMMARY OF THE INVENTION

One aspect of the present invention is a method of measuring coverage of a formal verification property. The method includes receiving a model of a logic design wherein the model has a plurality of states. The method also includes receiving a property verified for the model of the logic design and receiving one or more observed signals for the property. The method further includes providing a set of covered states in which checking a value of the one or more observed signals is sufficient to determine the validity of the verified property.

A further aspect of the present invention is an alternate method of measuring coverage of a formal verification property. The method includes receiving a model of a logic design wherein the model has a plurality of states. The method also includes receiving a property verified for the model of the logic design and receiving one or more observed signals for the property. The method further includes providing a set of covered states for the observed signal of the property, wherein the set of covered states comprise each one of the states in which changing a value of the observed signal in the state causes the property to fail.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

The following detailed description describes a coverage metric to identify that part of a state space which is covered by properties verified by model checking. In each property, a signal is identified (or a proposition on several signals) as the observed signal in that property. The coverage metric measures the coverage of a set of properties with respect to the observed signal. The coverage metric identifies the reachable states in which the value of the observed signal determines the validity of the verified properties. Then a model checking algorithm can be used to check the correctness condition on the observed signal in these "covered" states to prove or disprove the property.

The detailed description is organized as follows. The first section describes a computer system upon which one embodiment of the present invention is implemented. The second section presents an overview of one embodiment of the present invention. The third section describes property coverage in formal verification. The fourth section presents an example embodiment of a method of computing a coverage metric. The fifth section provides example implementations of property coverage in formal verification. Finally, a conclusion is provided.

Example Computing System

Figure 1:
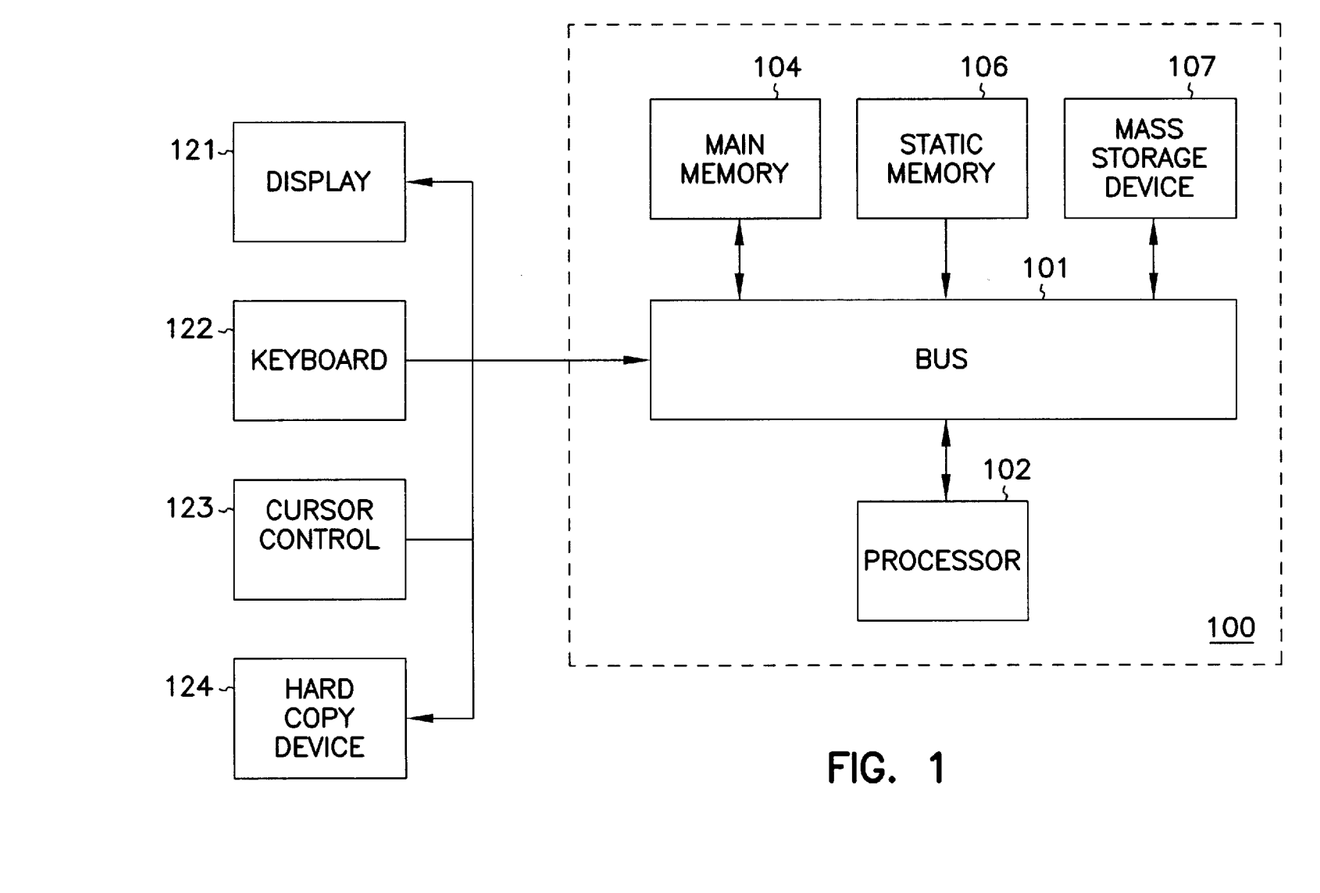
FIG. 1 is a block of a computer system upon which one embodiment of the present invention is implemented.

Referring to FIG. 1, a computer system upon which one embodiment of the present invention is implemented is shown as 100. Computer system 100 comprises a bus or other communication means 101 for communicating information, and a processor 102 coupled with bus 101 for processing information. Computer system 100 further comprises a random access memory (RAM) or other dynamic storage device 104 (referred to as main memory), coupled to bus 101 for storing information and instructions to be executed by processor 102. Main memory 104 also may be used for storing temporary variables or other intermediate information during execution of property coverage instructions by processor 102. Computer system 100 also comprises a read only memory (ROM) and/or other static storage device 106 coupled to bus 101 for storing static information and instructions for processor 102, and a data storage device 107 such as a magnetic disk or optical disk and its corresponding disk drive. Data storage device 107 is coupled to bus 101 for storing information and instructions for measuring coverage in formal verification properties. Computer system 100 may further be coupled to a display device 121, such as a cathode ray tube (CRT) or liquid crystal display (LCD) coupled to bus 101 for displaying information to a computer user. An alphanumeric input device 122, including alphanumeric and other keys, may also be coupled to bus 101 for communicating information and command selections to processor 102. An additional user input device may be cursor control device 123, such as a mouse, trackball, stylus, or cursor direction keys, coupled to bus 101 for communicating direction information and command selections to processor 102, and for controlling cursor movement on display 121. Another device which may be coupled to bus 101 is hard copy device 124 which may be used for printing instructions, data, or other information on a medium such as paper, film, or similar types of media. Note, also, that any or all of the components of computer system 100 and associated hardware may be used in one embodiment, however, it can be appreciated that any type of configuration of the system may be used for various purposes as the user requires in other embodiments.

Computer-readable instructions stored on a computer-readable medium (such as RAM, ROM, or other data storage devices) are executable by the processor 102 of computer system 100. The computer-readable instructions cause the computer system 100 to perform a method of measuring coverage of a formal verification property as further described below.

Overview of one embodiment of the Present Invention

Figure 2:
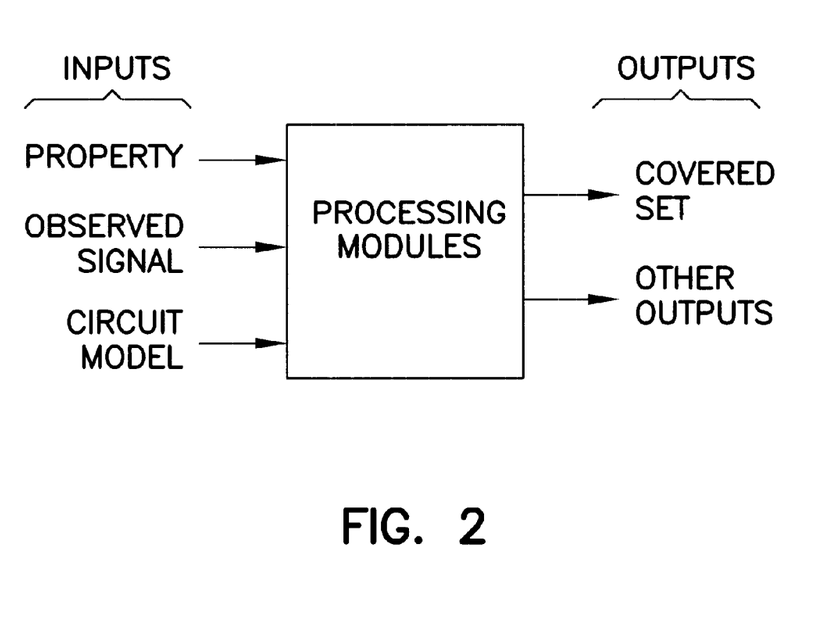
FIG. 2 is a block diagram of a system for measuring coverage of a formal verification property.

An overview of one embodiment of the present invention is described by reference to FIG. 2. FIG. 2 is a block diagram of a system for measuring coverage of a formal verification property. The system shown in FIG. 2 comprises inputs, processing modules, and one or more outputs.

The inputs comprise a property, one or more observed signals, and a circuit model or other logic design model. The property is a formal verification property specifying desired values of particular circuit signals at various points in time in relation to other signals. In one embodiment, the property is written in CTL. However, those skilled in the art will recognize that other property specification languages may be employed without diverting from the scope of the present invention.

The observed signal is a particular one of the circuit signals specified by the property. The observed signal is the signal being checked. In one embodiment, the observed signal is provided by a user. In an alternate embodiment, the observed signal is identified by the processing modules. The circuit model is a model of an integrated circuit design for use with a model checking verification tool and for use with the system of the present invention.

The processing modules comprise program modules that perform the function of measuring the coverage of properties by a model checking verification tool or in an alternate embodiment by a simulation checker. Generally, program modules include routines, programs, objects, components, data structures, etc., that perform particular functions or implement particular abstract data types. The processing modules provide an indication of the completeness of the verification. The coverage metric executed by the processing modules is based on states rather than paths. Example embodiments of the coverage metric are described in detail below. The term "state" as used herein means both states and inputs. State coverage is static in the sense that a state may be reached via several paths.

In one embodiment, the outputs comprise a coverage percentage indicating the percentage of states in which the observed signal has been checked for the property. Additional outputs will be readily apparent from the following detailed description.

Property Coverage in Formal Verification A "formula" (also referred to as a "property") specifies the desired values of particular circuit signals at various points in time in relation to other signals. In other words, each formula specifies a correctness condition on certain circuit signals and also specifies where in the circuit state space this condition should hold. One of the signals or propositions being checked in the correctness condition is identified as the "observed signal" and coverage is defined on this observed signal. In one embodiment, a sequential circuit is viewed as a Mealy finite state machine.

Definition 1: A finite state machine (FSM) M is a 4-tuple$<S, T_M, P, S_1>$, where S is a finite set of states, $T_M \subseteq S \times S$ is a transition relation of M between pairs of states in S, and $P=\{p_1, p_2, \ldots, p_n, q\}$ is a set of signals, where q is the observed signal. Each signal is a Boolean function $S \rightarrow \{T, F\}$ representing a set of states, or equivalently, each signal corresponds to an atomic proposition. $S_1 \subseteq S$ is a set of initial states.

Given a property that has been verified by a model checking algorithm to be true of the circuit, the present invention defines coverage of that property for the specified observed signal in terms of a subset of circuit states reachable from the initial states. A state is reachable from the initial states if there exists an input sequence which takes the FSM from an initial state to that state. In one embodiment, a "covered set" of states for an observed signal is the set of reachable states in which the values of the observed signal must be checked to prove satisfaction of the property.

Thus, states in the covered set have two characteristics. First, if the value of the observed signal is changed in any state of the model outside the covered set, the property should still be satisfied. Those states are not checked for the property. Second, if the value of the observed signal is changed in any covered state, the property should fail. In this embodiment, the set of covered states is a minimal set.

To determine whether a state belongs in the covered set, the value of the observed signal in that state is modified and its effect on the validity of the property is assessed. To facilitate this test, a dual FSM is defined for each state of the given FSM M as follows:

Definition 2: Given an FSM M=<S, $T_M$, P, $S_1$>, where P={$p_1, p_2, \ldots, p_n$, q}, and any state s ∈ S, the dual FSM $\hat{M}_s$ with respect to state s is the 4-tuple<S, $T_M$, {$p_1, p_2 \ldots, p_n, \hat{q}_s$}, $S_1$>, where $$\hat{q}_s(t) = \begin{cases} q(t) \mid (t \neq s) \\ \neg q(t) \mid (t = s) \end{cases}$$

With this definition, an embodiment of a covered set of states is defined as follows.

Definition 3: Given a property f and an FSM M such that M satisfies f with respect to its initial state set $S_1$, denoted by M, $S_1$|=f, a set C ⊆ S is a covered set of f on M for observed signal q if and only if for any state s ∈ S, the dual FSM satisfies the condition ($\hat{M}_s$, $S_1$|≠f)⇔(s ∈ C).

This definition is independent of the property specification language and guarantees that changing the value of the observed signal in an uncovered state will not cause the property to fail while changing the value in a covered state will cause it to fail. This set of covered states is unique. Consequently, it constitutes a necessary and sufficient set to prove satisfaction of the property. Covered states are defined in this manner so that the value of the observed signal on those states is guaranteed to satisfy the correctness conditions specified by the property. Thus, coverage gives a measure of how much of the state space of the model has been checked by the verified property for the observed signal. This definition does not preclude multiple observable signals in the same property. The covered states are then simply the union of the covered states for each individual signal.

To prove by contradiction that the set of covered states is unique, assume that there are two distinct covered sets $C_1$ and $C_2$ for a property f and an observed signal q. As $C_1 \neq C_2$, there must exist a state s which belongs to one but not the other, say s ∈ $C_1$ and s ∉ $C_2$ without loss of generality. By the definition of covered set $C_1$, if the value of q is changed in state s, the property f fails. This implies that s should belong to all covered sets and therefore s ∈ $C_2$, which is a contradiction. Therefore, $C_1$=$C_2$ and the set of covered states is unique.

Figure 3:
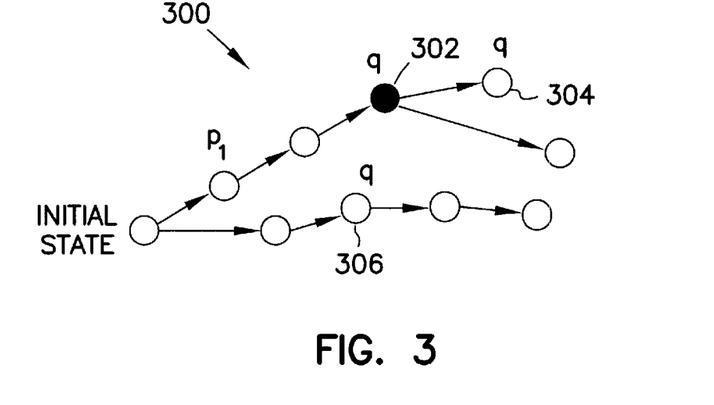
FIG. 3 illustrates a fragment of a state transition graph of a circuit for which property coverage is being computed.

The following example illustrates the definition of a covered state by reference to FIG. 3. This example computes coverage of the following simple CTL formula with q as the observed signal: AG ($p_1$→AX AX q). The formula specifies that whenever $p_1$ is asserted, q will be asserted two steps in the future. FIG. 3 illustrates a fragment of a state transition graph 300 of the circuit for which property coverage is being computed. Consequently, q must be asserted in the marked state 302 in FIG. 3 for the formula to hold. This marked state 302 is a covered state. Inspection shows that the condition specified in Definition 3 above holds for this state. Note that there are other states 304, 306 with q asserted but are not marked as covered since they are not critical to the validity of the given formula.

In an alternate embodiment, a less strict definition of a covered set is a set of states in which it is sufficient, but not necessary, to check the value of the observed signal to determine the validity of the CTL formula. A covered set in this case may be neither unique nor minimal.

Definition 4: Coverage of a formula for an "observed signal" on a given model with a given set of initial states is computed as the fraction of reachable states of the model that are covered:

$$\text{coverage} = \frac{\text{number of covered states}}{\text{number of reachable states}} \times 100\%$$

Coverage for a set of properties is simply the coverage from the union of the covered sets from each individual property.

Full or 100% coverage for a particular observed signal thus means that the value of that signal has been checked by the verified properties on all reachable states of the circuit. This serves as a very useful indicator of the completeness of the properties and the quality of the verification. More importantly, the formulation of the coverage metric allows the identification of areas with low coverage in terms of uncovered states so that the user can write additional properties to increase the coverage.

In an alternate embodiment, this coverage metric is also applicable to measurement of coverage for simulation tests. In which case, a covered state is defined as a state where the simulation checker checks the value of the observed signal during simulation.

The definition of coverage presented above is applicable to any property specification language. The remainder of this section of the detailed description presents an example embodiment of an algorithm to compute a covered set for a subset of ACTL, the universal subset of CTL.

The subset of ACTL acceptable to us is defined as follows:

$$f ::= b \mid b \rightarrow f \mid AXf \mid AGf \mid A[f \cup g] \mid f \wedge g$$

where b is a propositional formula and f and g are temporal formulas within the subset. Note that AF f can be equivalently written as A[True U f] and does not need to be treated separately. The only ACTL construct missing from this subset is disjunction of temporal formulas.

Figure 4:
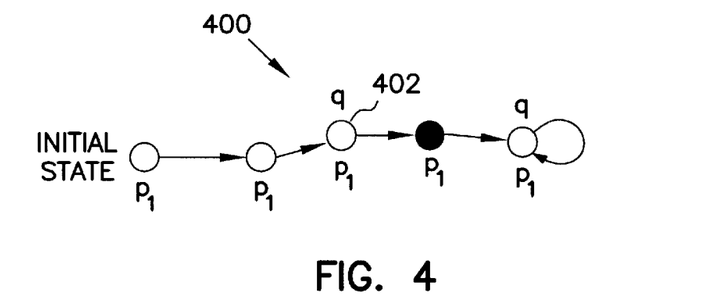
FIG. 4 illustrates a second state transition graph of a circuit for which property coverage is being computed.

Applying Definition 3 to this subset of ACTL, the set of states where the value of the observed signal is crucial to the validity of the formula can be computed exactly. However, applying Definition 3 in such a manner results in some unexpected coverage. The coverage for "eventuality properties" is extremely low. For instance, consider the property A[$p_1$ Uq] and the state transition graph of a circuit as shown in FIG. 4. The property specifies that $p_1$ should be high on any path from an initial state until observed signal q is asserted. Intuitively, it appears that the first state encountered where q is asserted should be covered (as marked in FIG. 4). However, changing the value of q in this states does not cause the property to fail because $p_1$ is high in that state. In fact, none of the states on this path will be considered covered by the definition. Thus, the coverage for this property will be zero. This is contrary to the expectation from such a property. To obtain a more intuitive measure of coverage, the coverage effects of the two parts of the Until formula need to be isolated from each other and coverage for each part computed separately. To achieve this, a transformation on ACTL formulas is defined below. The transformation changes the syntactic structure of the formulas but maintains semantic equivalence.

Definition 5: For an FSM M, given a formula f in the acceptable ACTL subset and an observed signal q within the formula, a signal q' is introduced. The signal q' is defined by the same function as the observed signal q. The "observability transformation," $\phi$, is defined by substituting occurrences of q in f with q' (denoted by f|q→q')

$\phi(b\rightarrow j)=b\rightarrow\phi(f)$ $\phi(b)=b$ |q→q'

$\phi(AXf)=AX\phi(f)$ $\phi(AGf)=AX\phi(f)$ $\phi(A[Ug])=A[\phi(f)Ug]\wedge A[f\rightarrow g)U\phi(g)]$ $\phi(f\wedge g)=\phi(f\wedge\phi(g)$ f and g' are written as the shorthand for $\phi(f)$ and $\phi(g)$ respectively. The new signal q' is now the observed signal for the transformed formula f.

Note that the formulas after the observability transformation are equivalent to the original formulas with respect to validity of the verification. The only two cases in which the syntactic structure of the formula change are the implication and Until formulas. The motivation is to pinpoint the states which contribute coverage from the consequent part of the implication as well as the states which independently contribute coverage from each part of the Until formula. As a result of the observability transformation, two semantically equivalent formulas with different syntax can provide different coverage. Thus, the syntax of the formula better captures the verification intent of the user. The application of Definition 3 to the transformed formulas gives a more intuitive and pragmatic determination of the covered set. The observability transformation is consistent with the definition of a covered state where the set of covered states is identified as a set of states in which it is sufficient to check the value of the observed signal to determine the validity of the CTL formula.

Coverage Computation

This section of the detailed description presents an example embodiment of a method of computing the coverage metric. The example embodiment is a recursive algorithm to compute the set of covered states in the state space of an FSM for a given ACTL formula and a given observed signal. The algorithm operates on the original formula but gives the computed set of covered states with respect to the transformed formula as described above. Thus, in this embodiment, the computation of coverage does not require application of the observability transformation. Later, it is proved that the computed covered set is the same set of states as would have been obtained by direct application of Definition 3 to the transformed formula.

Problem Statement: Given an FSM M with a set of initial states $S_1$ and an acceptable ACTL formula g such that M, $S_1$|=g, compute the set of covered states and the coverage for observed signal q.

Coverage for a nested formula g is computed in a recursive manner on the syntactic structure of g. This algorithm is summarized by Table 1 below. Coverage for each sub-formula is computed with respect to a set of start states. The covered state set for formula g with respect to start state set $S_0$ is denoted by $C(S_0, g)$. Traversing down a parse tree, the set of start states used to compute coverage for a particular sub-formula changes, as shown in the table. Coverage for the top-level formula g is computed with respect to the set of initial states $S_1$ of M(substituting $S_0=S_1$ in Table 1), i.e., $C(S_1, g)$.

The algorithm guarantees that the value of the observed signal in any covered state satisfies the correctness condition specified by the formula. If a sub-formula does not involve the observed signal, its covered set will be empty. Definitions of the functions used in the algorithm are given below.

TABLE 1

Recursive computation of covered set

| $C(S_0, g)$ | Covered Set of States |
|---|---|
| $C(S_0, b)$ | $S_0 \cap$ depend(b) |
| $C(S_0, b \rightarrow f)$ | $C(S_0 \cap T(b), f)$ |
| $C(S_0, AXf)$ | $C(forward(S_0), f)$ |
| $C(S_0, AGf)$ | $C(reachable(S_0), f)$ |
| $C(S_0, A[f_1 U f_2])$ | $C(traverse(S_0, f_1, f_2), f_1) \cup$ $C(firstreached(S_0, f_2), f_2)$ |
| $C(S_0, f_1 \wedge f_2)$ | $C(S_0, f_1) \cup C(S_0, f_2)$ |

Given a propositional formula b, let T(b) represent the set of states which satisfy b. Note that the property is satisfied by the circuit if and only if b is true in all start states. The subset of these start states which are covered is identified as those start states where the satisfaction of predicate b actually depends on the value of observed signal q (b may also specify conditions on other signals). In other words, changing the value of observed signal q on a covered state must falsify the formula b on that state when otherwise it would be true. In the above table, this set of states is given by the function depend(b)=T(b)∩T(¬b|q¬q).

The computation for formulas of type b→f, AXf, and AGf is straightforward. The formula b→f specifies that the formula f must be true on those start states in $S_0$ which satisfy the predicate b. The covered set $C(S_0, b\rightarrow f)$ of the sub-formula b→f with respect to the start states $S_0$ is equivalent to, and computed as, covered set $C(S_0 \cap T(b), f)$ for f with respect to the new set of start states $S_0 \cap T(b)$.

The formula AXf specifies that f holds in all successor states from the start state set $S_0$. The function forward($S_0$) gives states reachable in exactly one step from the start states in $S_0$. This set becomes the new start states while computing coverage for f.

forward($S_0$)={s"|∃s'∈$S_0$, (s', s")∈$T_M$}

AG f specifies that f holds on all states reachable from $S_0$. The function reachable($S_0$) gives states reachable from $S_0$ in any number of forward steps. This set becomes the new set of start states for computing coverage of f.

$$reachable(S_0) = \bigcup_{t=0}^{\infty} forward^t(S_0)$$

Figure 5:
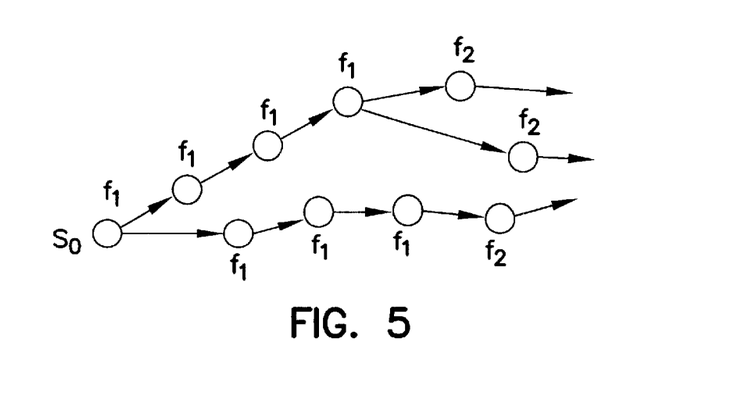
FIG. 5 illustrates a third state transition graph of a circuit for which property coverage is being computed.

The coverage estimation for the Until operator is a little more complicated. The computation of covered states for $A[f_1 U f_2]$ is explained with the help of the state transition graph in FIG. 5. Sub-formula $f_1$ is verified to be true on states along paths from a start state (unique in this example) in $S_0$, such that $f_1$ is true until $f_2$ first becomes true. The function traverse($S_0, f_1, f_2$) identifies states along paths starting from states in $S_0$ such that $f_1$ is true and $f_2$ is not true until, but not including, states where $f_2$ becomes true. These states are marked and labeled by $f_1$ in FIG. 5 and become the new set of start states while computing coverage for sub-formula $f_1$.

traverse $(S_0, f_1, f_2) = S'_0 \cup$ traverse (forward $(S'_0), f_1, f_2$)

where $S'_0 = S_0 \cup T(f_1) \cup T(\neg f_2)$.

In addition, the states satisfying $f_2$ first encountered while traversing forward from $S_0$ are considered as start states for computing coverage for propositional sub-formula $f_2$. These are marked and labeled by $f_2$ in FIG. 5, and are computed by the function firstreached($S_0,f_2$).

firstreached($S_0,f_2$) = ($S_0 \cap T(f_2)$) $\cup$ firstreached(forward($S_0 \cap T(\neg f_2)$), $f_2$)

The covered set of the Until formula is the union of the coverage from C(traverse($S_0,f_1,f_2$),$f_1$) and C(firstreached($S_0,f_2$),$f_2$).

The covered set of a formula which is a conjunction of two sub-formulas is simply the union of the covered sets of the sub-formulas, because both sub-formulas must be satisfied by the FSM for the conjuncted formula to be satisfied.

Correctness Theorem: Given an FSM M with initial states $S_1$ and an acceptable ACTL formula g with observed signal q, the above algorithm computes correctly the set of covered states as specified by Definition 3 for the transformed formula $g'=\phi$ (g) and observed signal $q'$, where $\phi$ is the observability transformation.

Proof: The proof is by induction on the structure of the formula. Except for the three cases involving temporal operators, all other cases can be easily obtained from the definitions of coverage, the observability transformation and the algorithm. The cases of AX and AG operators follow directly from the following equations:

$$(M, \text{forward } (S_0)|=f) \Leftrightarrow (M, S_0|=(AXf))$$

$$(M, \text{reachable } (S_0)|=f) \Leftrightarrow (M, S_0|=(AGf))$$

The most complex case is the Until operator. The two terms in the definition of the observability transformation correspond to the two sets in the coverage algorithm. Since traverse($S_0,f_1,f_2$) represents the set of states on paths starting from $S_0$ that satisfy $f_1$ and do not satisfy $f_2$ until and not including states that satisfy $f_2$, the covered set computed by C(traverse($S_0,f_1,f_2$), $f_1$) is the correct covered set for $A[f_1 U f_2]$. Likewise, the covered set computed by C(firstreached($S_0,f_2$), $f_2$) is the correct covered set for $A[(f_1 \wedge f_2) U f_2]$.

This algorithm is of the same order of complexity as conventional symbolic model checking algorithms. Both are based on fix point computation using Binary Decision Diagrams (BDDs) which are exponential in the worst case. Results for sub-formulas computed during verification can be memoized and used during coverage estimation for a more efficient implementation. In practice, coverage estimation can be slightly more expensive than the verification in some cases because it may require computing the reachable states. This involves fix point computation which may not have been necessary for the actual verification of the CTL formulas.

In the example embodiment described above, after computing the set of reachable states and the set of covered states, the coverage estimator gives the coverage percentage and, in one embodiment, prints out a list of uncovered states. This output aids the user in writing additional properties to cover the holes. The coverage estimator also prints out traces to uncovered states by performing a breadth first reachability analysis from the initial states to an uncovered state via the shortest path and generating an input sequence corresponding to this path.

Example Implementations of Property Coverage in Formal Verification

The embodiments of the coverage metric described above are useful in achieving a high degree of confidence in the completeness of the verification. A coverage estimator module for measuring coverage of desired properties should be used after the normal specification and verification cycle has been completed and the user is reasonably confident of the completeness of the verification. In one embodiment, the verification is performed by a model checking module. The coverage estimator module then measures the coverage of the desired properties.

Using the metric presented here, the verification engineer is able to identify behaviors exhibited by the circuit that have not been checked by any property. The first step in this process is to inspect uncovered states provided by the coverage estimator. If it is not immediately apparent from this inspection how to strengthen the verification to cover that hole, the second step is to instruct the system of the present invention to generate traces to specific uncovered states. These traces are evidence of circuit behavior leading to uncovered states and provide strong hints as to the nature of additional properties required to achieve higher coverage. The user can then strengthen the verification either by writing additional properties or improving existing ones by weakening the antecedent or strengthening the consequent. In one embodiment, the minimum coverage requirement recommended is 100% coverage for each primary output signal and each significant circuit signal.

A large fraction of the set of states not covered by the properties could be states on which the value of the observed signal is irrelevant to the correctness of the circuit. In one embodiment, these "don't care" states are supplied by the user as a set of propositions on state variables and excluded from the coverage space so as to give a more realistic coverage estimate.

Fairness conditions expressed in the model checking system constrain the system to only look at fair paths during the verification of a property, i.e., paths where the fairness constraints are true infinitely often. The presence of fairness constraints therefore requires the coverage estimation algorithm also to ignore states not falling on fair paths. In one embodiment, coverage is computed as the fraction of states reachable along fair paths.

A coverage estimator module according to the present invention has been implemented in conjunction with one version of SMV and applied to circuits from a microprocessor design. A signal from each circuit was selected as the observed signal and applied the estimator to determine the coverage of properties which had been verified to check behavior of the signal. Table 2 below gives the names of the observed signals for which coverage was measured, the number of properties verified for that signal, the coverage obtained for the given set of properties, the performance of model checking measured in terms of the number of BDD nodes and the run time in seconds on a HP9000 workstation, and the runtime performance of the coverage estimator.

TABLE 2

Coverage results

| Signal | # Prop | % COV | Verification BDDs - time | Coverage BDD - time |
|---|---|---|---|---|
| Circuit 1 (priority buffer) | | | | |
| hi-pri | 5 | 100.00 | 124 k–59.28 s | 150 k–60.41 s |
| lo-pri | 5 | 99.98 | 155 k–61.37 s | 178 k–71.26 s |
| Circuit 2 (circular queue) | | | | |
| wrap | 5 | 60.08 | 26 k–8.3 s | 26 k–7.46 s |
| full | 2 | 100.00 | 21 k–1.55 s | 21 k–1.52 s |
| empty | 2 | 100.00 | 13 k–1.51 s | 13 k–1.55 s |

TABLE 2-continued

Coverage results

| Signal | # Prop | % COV | Verification BDDs - time | Coverage BDD - time |
|---|---|---|---|---|
| Circuit 3 (pipeline) | | | | |
| output | 8 | 74.36 | 10 k–3.58 s | 10 k–7.42 s |

Circuit 1 is a priority buffer which schedules and stores incoming entries according to their priorities (high or low). The model had 24 variables. Given the number of entries already in the buffer and the number of incoming entries, the properties specify the correct number of entries in the buffer at the next clock. For example, if the buffer currently has B entries and I incoming entries and I+B is less than the size of buffer, then the buffer in the next clock should have I+B entries. High and low priority entries are checked by different properties, and their counts are considered as the observed signals. The set of verified properties should provide a complete analysis of all possible cases, but a missing case was uncovered when the buffer is empty and low priority entries are incoming, the entries should be stored. A simple additional property was written to cover this case. Verification of this property failed and actually revealed a bug in the design of the buffer.

Circuit 2 is a circular queue controlled by a read pointer, a write pointer and a wrap bit that toggles whenever either pointer wraps around the queue. It also has stall, clear and reset signals as inputs. Properties were written to verify the correct operation of the wrap bit, the full and empty signals. The model had 38 variables. The coverage for the full and empty signals was 100%. But coverage for the wrap bit was 60%. Inspecting the uncovered states, three additional properties were written which still did not achieve 100% coverage. The input/state sequences leading to these uncovered states was traced and found that the value of wrap bit was not checked if the stall signal was asserted when the write pointer wraps around. Such a subtle corner case can easily be missed during property specification. A property was added to specify that the wrap bit remains unchanged for this case and 100% coverage was achieved.

Circuit 3 is a pipeline in the instruction decode stage of the processor. The width of the pipeline datapath was abstracted to a single bit. Properties were verified on this signal to check the correct staging of data through the pipeline, rather than the actual data transformations. These properties generally took the form that an input to the pipeline will eventually appear at the output given certain fairness conditions on the stalls. The final model had 15 variables. Coverage was increased to 100% by identifying uncovered states and enhancing the set of properties.

These examples demonstrate that coverage estimation can improve the quality of FV. The runtimes and memory requirements are similar to those required by the actual verification. Furthermore, the example are a good representation of common FV properties: the buffers involved syntactically simple properties, e.g., AG($p_1 \rightarrow$AX ... AX$p_2$) and the pipeline required eventuality properties using the Until operator in a nested manner, e.g., AG($p_1 \rightarrow$A[$p_2$UA[$p_3$U$p_4$]]).

Conclusion

The detailed description has described a coverage metric for model-checking based verification methodologies. An example embodiment of a coverage metric for model checking that is applicable to a significant subset of CTL has also been described. The coverage metric identifies property coverage holes that can lead to the discovery of bugs that escaped the model checking process.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method comprising:
   receiving a model of a logic design wherein the model has a plurality of states;
   receiving a property verified for the model of the logic design;
   receiving one or more observed signals for the property; and
   providing a set of covered states in which checking a value of the one or more observed signals is sufficient to determine the validity of the property.

2. The method of claim 1, further comprising
   identifying a set of reachable states for the one or more observed signals of the property; and
   calculating a coverage percentage wherein the coverage percentage is a fraction of the set of reachable states.

3. The method of claim 2, further comprising providing a set of uncovered states if the coverage percentage is less than one hundred percent.

4. The method of claim 3, further comprising displaying a list of the states comprising the set of uncovered states.

5. The method of claim 4, wherein the list of the states comprising the set of uncovered states can be modified by a user as desired.

6. The method of claim 3, further comprising generating a trace of the states leading to one of the states in the set of uncovered states.

7. The method of claim 6, wherein generating the trace further comprises performing a breadth first reachability analysis from one or more initial states to the uncovered state via a shortest path and generating an input sequence corresponding to the shortest path.

8. The method of claim 1, further comprising displaying a list of the states comprising the set of covered states.

9. The method of claim 8, wherein the list of the states comprising the set of covered states can be modified by a user as desired.

10. The method of claim 1, further comprising generating a trace of the states leading to one of the states in the set of covered states.

11. A method comprising:
    receiving a model of a logic design wherein the model has a plurality of states;
    receiving a property verified for the model of the logic design;
    receiving one or more observed signals for the property; and
    providing a set of covered states for the one or more observed signals of the property, wherein the set of covered states comprise each one of the states in which changing a value of the observed signal in the state causes the property to fail.

12. The method of claim 11, further comprising providing a set of uncovered states for the one or more observed signals of the property, wherein the set of uncovered states comprise each one of the states in which the value of the observed signal has no effect on the validity of the property.

13. The method of claim 12, further comprising displaying a list of the states comprising the set of uncovered states.

14. The method of claim 13, wherein the list of the states comprising the set of uncovered states can be modified by a user as desired.

15. The method of claim 12, further comprising generating a trace of the states leading to one of the uncovered states.

16. The method of claim 15, wherein providing the trace further comprises performing a breadth first reachability analysis from one or more initial states to the uncovered state via a shortest path and generating an input sequence corresponding to the shortest path.

17. The method of claim 11, further comprising:
identifying a set of reachable states for the one or more observed signals of the property; and
calculating a coverage percentage wherein the coverage percentage is a fraction of the set of reachable states.

18. The method of claim 11, further comprising displaying a list of the states comprising the set of covered states.

19. The method of claim 18, wherein the list of the states comprising the set of covered states can be modified by a user as desired.

20. The method of claim 11, further comprising generating a trace of the states leading to one of the covered states.

21. A method comprising:
providing a first set of covered states for a first observed signal of a first property;
providing a second set of covered states for a second observed signal of a second property; and
performing a union operation between the first set of covered states and the second set of covered states to identify a third set of covered states for the first property and the second property.

22. An article comprising:
a computer-readable medium including instructions that when executed cause a computer to:
receive a model of a logic design wherein the model has a plurality of states;
receive a property verified for the model of the logic design;
receive one or more observed signals for the property; and
provide a set of covered states in which checking a value of the one or more observed signals is sufficient to determine the validity of the property.

23. The article of claim 22, wherein the computer-readable medium further comprises instructions that when executed cause the computer to identify a set of reachable states for the one or more observed signals of the property; and calculate a coverage percentage wherein the coverage percentage is a fraction of the set of reachable states.

24. The article of claim 22, wherein the computer-readable medium further comprises instructions that when executed cause the computer to provide a set of uncovered states for the one or more observed signals of the property.

25. An article comprising:
a computer-readable medium including instructions that when executed cause a computer to:
receive a model of a logic design wherein the model has a plurality of states;
receive a property verified for the model of the logic design;
receive one or more observed signals for the property; and
provide a set of covered states for the one or more observed signals of the property, wherein the set of covered states comprise each one of the states in which changing a value of the one or more observed signals in the state causes the property to fail.

26. A method comprising:
receiving a set of simulation tests;
receiving a set of simulation checkers;
receiving a set of observed signals; and
providing a set of covered states for one or more of the observed signals, wherein the set of covered states comprise each one of the states in which the value of the observed signal is checked by the simulation checker during the simulation test.

27. A method comprising:
receiving a model of a logic design wherein the model has a plurality of states;
receiving a property verified for the model of the logic design;
identifying one or more observed signals for the property; and
providing a set of covered states in which checking a value of the one or more observed signals is sufficient to determine the validity of the property.

28. A method comprising:
receiving a model of a logic design wherein the model has a plurality of states;
receiving a property verified for the model of the logic design;
identifying one or more observed signals for the property; and
providing a set of covered states for the one or more observed signals of the property, wherein the set of covered states comprise each one of the states in which changing the value of the one or more observed signals in the state causes the property to fail.

* * * * *

UNITED STATES PATENT AND TRADEMARK OFFICE
CERTIFICATE OF CORRECTION

PATENT NO. : 6,484,134 B1
DATED : November 19, 2002
INVENTOR(S) : Yatin V. Hoskote It is certified that error appears in the above-identified patent and that said Letters Patent is hereby corrected as shown below:

Title page,
Item [56], References Cited, OTHER PUBLICATIONS, "Fallah et al" reference, insert -- . -- after "et al".
"Moundanos et al" reference, insert -- . -- after "et al".
"Pixley et al" reference, insert -- . -- after "et al".
"McMillian" reference, delete "McMillian" and insert -- McMillan -- therefor.

Column 5,
Lines 17-18, insert -- for every state $t \in S$. -- after the formula:

$$\hat{q}_s(t) = \begin{cases} q(t) \,|\, (t \neq s) \\ -q(t) \,|\, (t = s) \end{cases}$$

Column 7,
Line 13, delete "$\Phi(A[Ug])=A[\Phi(f)Ug]\Lambda\ A[(f-g)U\Phi\ (g)]$" and insert
-- $\Phi(A[fUg]) = A[\Phi(f)Ug]\Lambda A\ [(f\Lambda\text{-}g)U\Phi(g)]$ -- therefor.
Line 14, delete "$\Phi(f\Lambda g)=\Phi(f\Lambda\Phi(g)$" and insert -- $\Phi(f\Lambda\ g) = \Phi(f)\Lambda\Phi(g)$ -- therefor.

Column 8,
Line 65, delete "$S'_0=S_OUT(f_1)UT(\text{-}f_2)$" and insert -- $S'_O = S_0 \cap T(f_1) \cap T(\text{-}f_2)$ -- therefor.

Signed and Sealed this

Seventeenth Day of August, 2004

JON W. DUDAS
*Acting Director of the United States Patent and Trademark Office*